United States Patent [19]

Hassan et al.

[11] 4,042,119
[45] Aug. 16, 1977

[54] WORKPIECE POSITIONING APPARATUS

[75] Inventors: Javathu Kutikaran Hassan, Hopewell Junction; Carl Vincent Rabstejnek, Wappingers Falls, both of N.Y.

[73] Assignee: International Business Machines Corporation, Armonk, N.Y.

[21] Appl. No.: 592,152

[22] Filed: June 30, 1975

[51] Int. Cl.² .............................................. B25J 3/04
[52] U.S. Cl. ............................. 214/1 CM; 214/1 BB
[58] Field of Search ........................ 29/200 P, 203 P; 214/1 R, 1 F, 1 BB, 1 CM, 1 B; 176/30, 37; 318/593, 601, 617

[56] References Cited

U.S. PATENT DOCUMENTS

| | | | |
|---|---|---|---|
| 2,756,857 | 7/1956 | McCorkle | 214/1 CM X |
| 3,525,140 | 8/1970 | Cachon et al. | 29/200 P |
| 3,733,484 | 5/1973 | Bayard | 318/601 |
| 3,779,400 | 12/1973 | Brocuman et al. | 214/1 CM X |
| 3,860,124 | 1/1975 | Bouygues et al. | 214/1 CM |

*Primary Examiner*—Frank E. Werner
*Attorney, Agent, or Firm*—Theodore E. Galanthay

[57] ABSTRACT

Disclosed is an X-Y table for positioning semiconductor workpieces in a vacuum environment with a high degree of speed and accuracy. The X and Y prime movers are mounted on adjacent external surfaces of the vacuum chamber. The first motor associated with the drive in the Y direction seals with an O-ring onto the front surface of the chamber. A second motor associated with the X drive is fixedly mounted to one of the sides of the chamber. The lower stage providing motion in the Y direction has a single degree of freedom relative to the vacuum chamber. The upper stage providing motion in the X direction is connected to the lower Y stage and has two degrees of freedom relative to the vacuum chamber. The entire X-Y table assembly is mounted on rails in parallel with the Y direction of motion such that by removing the front wall of the vacuum chamber, the entire assembly may be removed for repair and/or maintenance. By such modular replacement, the entire E-beam tool can resume operation.

5 Claims, 4 Drawing Figures

WORKPIECE POSITIONING APPARATUS

CROSS REFERENCES TO RELATED APPLICATIONS AND PATENTS

J. K. Hassan et al U.S. Pat. No. 3,886,421, issued May 27, 1975 and assigned to the assignee of the present application.

J. K. Hassan et al U.S. patent application Ser. No. 395,890, filed Sept. 10, 1973, now U.S. Pat. No. 3,904,945, issued Sept. 9, 1975, and assigned to the assignee of the present application.

BACKGROUND OF THE INVENTION

1. Field of the Invention

This invention relates to an X-Y positionable work station and more particularly to a very accurately and quickly positionable work station in a vacuum environment.

2. Description of the Prior Art

Generally, in the known prior art, systems operating in vacuum environments are not required to simultaneously perform to stringent specifications. As such, relatively loose designs are possible which are inaccurate or slow and do not severely stress the components. In the writing of photolithographic patterns on semiconductor workpieces by an electron beam in a vacuum environment, a very accurately positionable X-Y table is required. The table also has to function within a high vacuum environment, presenting stringent lubrication requirements and special material and component limitations. Also, the electron beam is greatly affected by moving magnetic material near the final lens, and by electro magnetic fields created in the vacinity of the lens. These considerations require that the electric drive motor be located outside the vacuum chamber to eliminate the outgassing friction of the brushes, and lubrication problems, as well as to attenuate the electro magnetic field. By placing the motors outside the vacuum chamber, heat transfer from the motor is also facilitated.

At the same time, the requirements for very fast and accurate positioning demand that the prime mover and associated linear actuators conform to prescribed requirements of good design of servo systems. Mandatory characteristics include items such as low friction, low compliance, high rigidity, high stiffness, and low mass, to achieve the maximum mechanical resonent frequency. This requires a minimal backlash linear actuator, and positive coupling between all the drive components, as well as positive coupling to the X-Y stage. Consequently, such items as flexible shafts and couplings are not desirable.

A system having the foregoing characteristics has many interactive parts requiring maintenance, repair, replacement, and diagnosis. A severe problem with prior art systems has been that the entire electron beam (E-beam) column which provides a control for the electron beam, must be lifted up with a crane to provide access to the workpiece positioning apparatus. The prior art teaches no quick and convenient way to remove the X-Y table, to perform necessary maintenence etc., and return the same into the vacuum chamber. Similarly, known techniques for conveniently accessing X-Y tables for maintenance and repair purposes would not be applicable to the highly fast and accurate X-Y positioning apparatus required herein.

SUMMARY OF THE INVENTION

Accordingly, it is a primary object of this invention to provide a remotely controllable workpiece positioning means with a high degree of accuracy and speed in a vacuum environment.

It is another object of this invention to provide an X-Y table for positioning semiconductor workpieces in a vacuum chamber for fabrication by an electron beam.

It is another object of this invention that the positioning system be shielded from the semiconductor workpieces so that the electron beam is not affected.

It is still another object of this invention that the X-Y positioning assembly are readily removable from the vacuum chamber.

In accordance with the present invention, the $x$ and $y$ stages are connected to a $y$ drive and flange assembly which seals with an O ring onto the front surface of the chamber. The lower, or $y$ stage is directly coupled by a drive bracket to the linear actuator. Both the drive assembly and the $y$ stage have a single degree of freedom relative to fixed references; such as the vacuum chamber. As the upper stage provides an $x$ motion and is mounted to the lower $y$ stage it has two degrees of freedom relative to the chamber walls. This is permitted by a drive arm coupling to a drive rail allowing independent motion of the bottom stage, and a fixed mounting of the $x$ drive and flange assembly relative to the chamber. Essentially, this allows precise, quick positioning of a workpiece within a vacuum in orthogonal directions relative to some fixed point relative to the chamber.

The table assembly is supported on stand off's and rails to allow clearance below for vacuum poppet valving, the $y$ drive assembly, and position feedback components. The cross references to related applications and patents describe the control means whereby this X-Y table is positioned. Refer to these cross references for greater detail. The table assembly is repeatably guided into place and positioned, when removed and/or replaced, with the aid of guide bearings mounted onto the rails.

The foregoing design is essentially a modular construction permitting the sliding out of the $y$ motor, the front wall or flange, and the remainder of the assembly as a single unit, for quick replacement and/or servicing. At the same time, the stringent requirements for accurate positioning within a vacuum system are maintained.

The foregoing and other objects, features, and advantages of the invention will be more apparent from the following more particular description of a preferred embodiment of the invention, as illustrated in the accompanying drawings.

DETAILED DESCRIPTION

Figure 1:
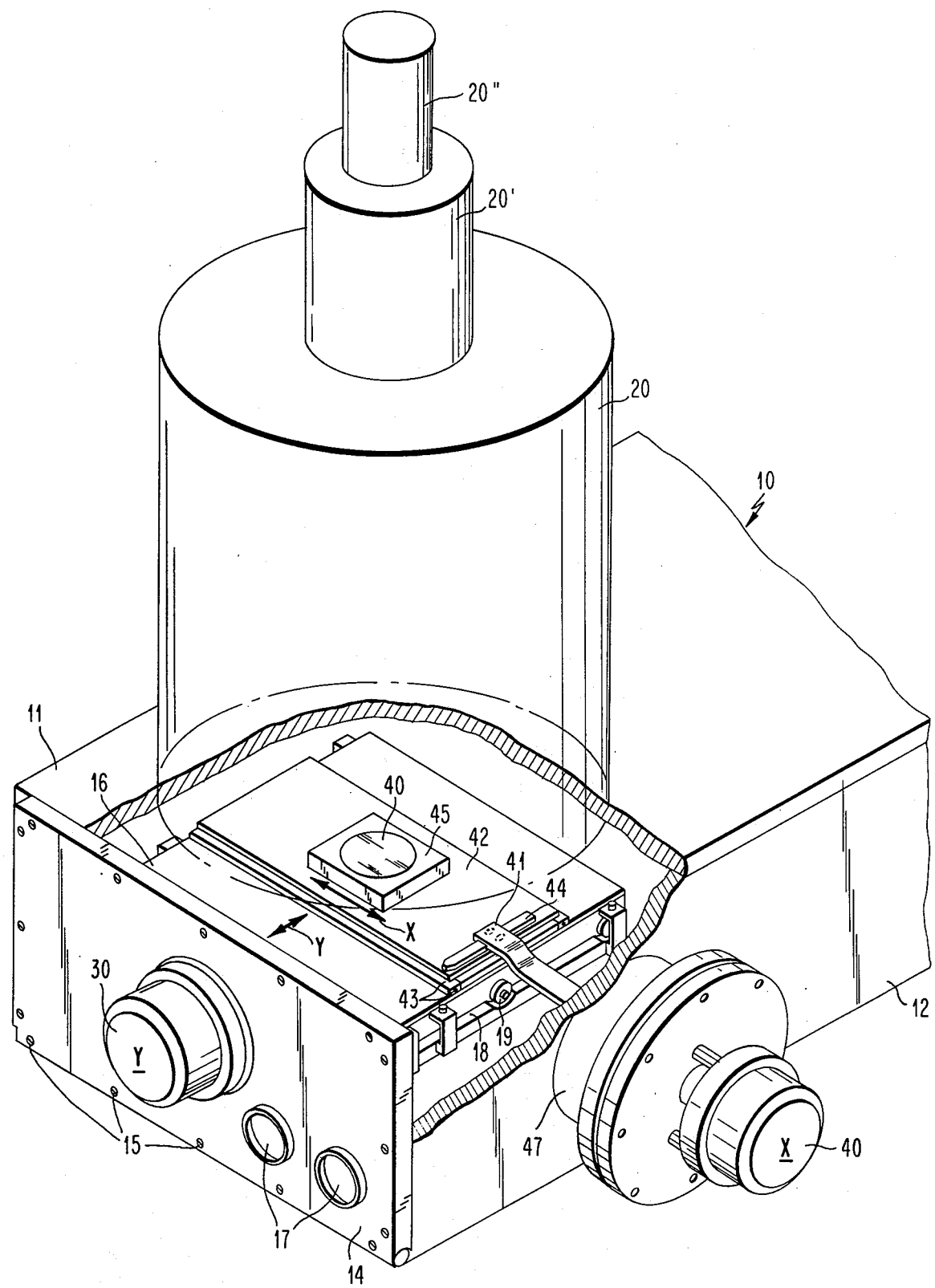
FIG. 1 is a schematic perspective view, partly in section, of a vacuum chamber and column with which the workpiece positioning apparatus of the present invention is employed.

Referring to the drawings and particularly FIG. 1, there is shown a vacuum chamber 10 with an E-beam column 20 mounted thereon. The vacuum chamber 10 is formed by a top wall 11, a sidewall 12, and front wall or flange 14, as well as another sidewall, a backwall, and a bottom wall (not shown). The Y motor is fixedly mounted to the front wall or flange 14. Also, the front wall or flange 14 is attached with screw holes 15 to the sidewalls, top wall, and bottom wall, also including a O ring (not shown) to form a vacuum seal. The entire Y drive assembly 16 is thus a single integral module with the front wall of the vacuum chamber. The front wall 14 also includes electrical feed through ports 17 which are sealed to hold the vacuum while containing the cables for carrying the necessary electrical signals. The Y drive and table assembly is supported on rail 18 and is movable in the Y direction on rollers 19. The X motor drive is mounted to sidewall 12 and imparts a linear motion in the Y direction to drive arm 41. The X table 42 is the upper table mounted on the Y table by means of linear slides 43. Table 42 has mounted thereon, and integral therewith, drive rail 44 arranged near one edge in a direction parallel with Y motion. The underside of drive arm 41 includes a pair of rollers (that are shown later herein) disposed on either side of drive rail 44. This permits drive rail 44 to be moved in the Y direction and indeed provides for the sliding out of the entire Y assembly and its reinsertion into the vacuum chamber. At the same time, drive arm 41 can exert pressure in the X direction on drive rail 44 thus providing a second degree of freedom to the resultant X-Y table. The workpiece support 45 including a schematically illustrated semiconductor wafer 46 are placed on the X-Y table as shown. It is here further pointed out that the rotary motion of X motor 40 is translated into the linear motion of arm 41 by a linear actuator located within housing 47. There is a similar linear actuator associated with Y motor 30.

Figure 2:
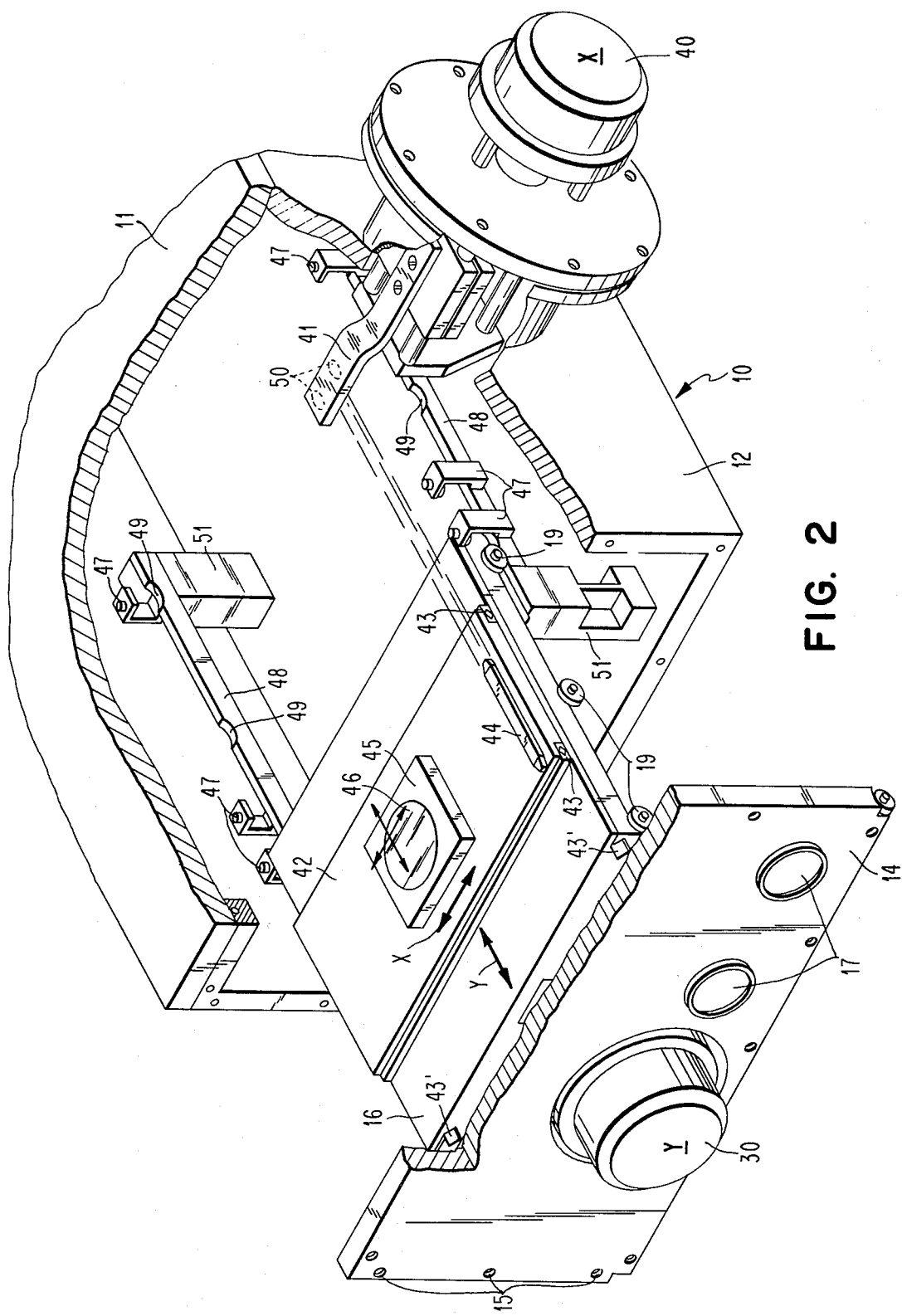
FIG. 2 is a schematic perspective view showing the assembly and $y$ drive almost completely removed from the vacuum chamber.

Refer now to FIG. 2 illustrating the X-Y table assembly in greater detail. Corresponding elements have been numbered with corresponding reference numerals insofar as practical. Note that the entire Y drive assembly, riding on tracks 48 with rollers 19, has been withdrawn from within the vacuum chamber. Note also indentations 49 in rails 48 in which rollers 19 become seated when the X-Y table is seated within the chamber. Guide bearings 47 mounted on each rail assure the straight travel of the entire unit during withdrawal and reinsertion. Also note rollers 50 mounted on the underside of drive arm 41 engaging drive rail 44 when the unit is inserted into the vacuum chamber.

The X motor 40 and the drive are subsequently removable by disengaging the fastening bolts. Also seem more clearly in FIG. 2 are supports 51 for rails 48. In practice, locating stops can be positioned in the brackets supporting guide bearings 47. These accurately locate the position of the X-Y table. Also, in practice encoders can be mounted between the table stages to accurately detect the X and Y position of the table and this information is passed through the cables through electric feed through ports 17.

Figure 3:
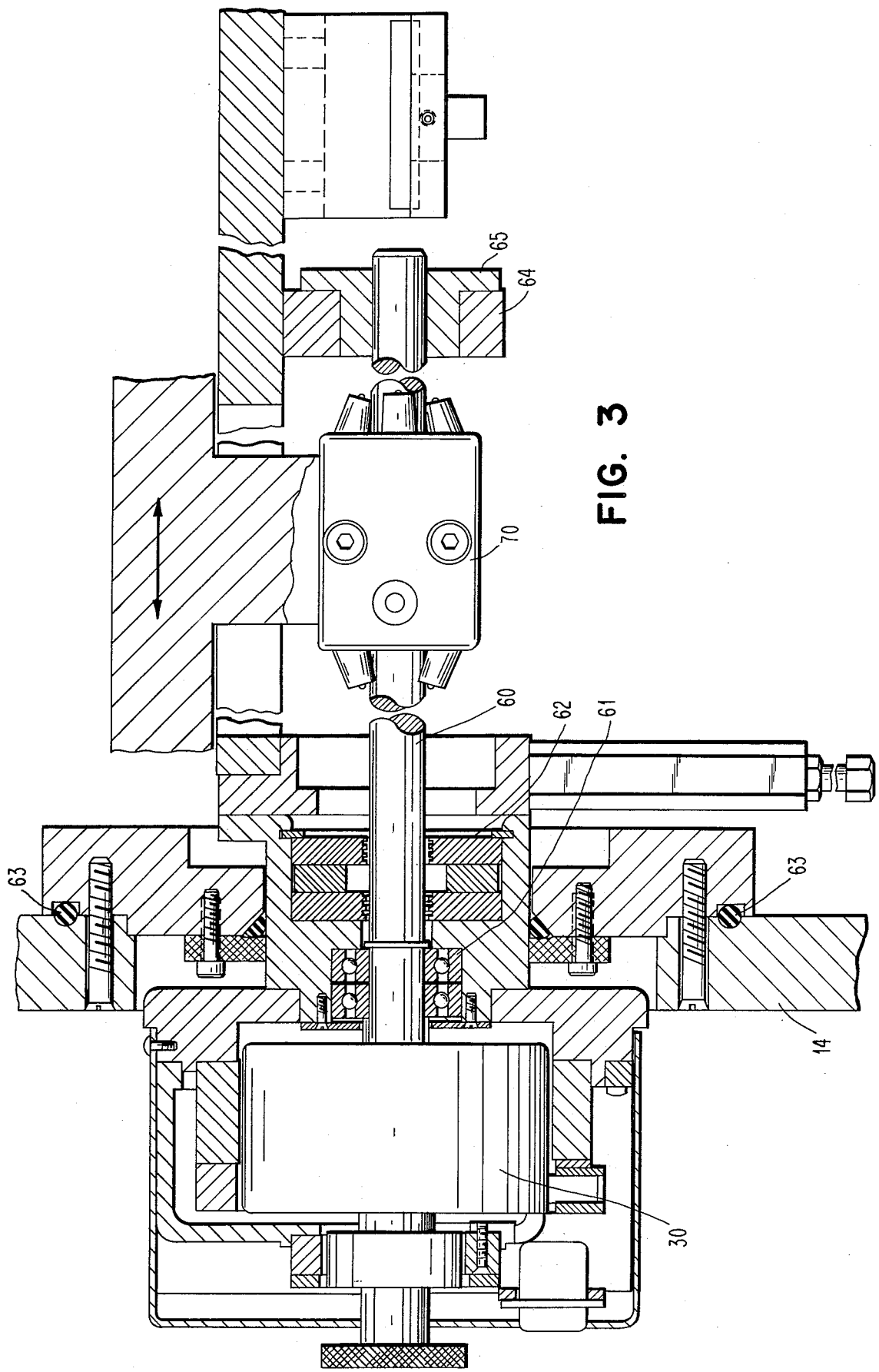
Fig. 3 is a sectional view illustrating the $y$ drive in greater detail.

Refer now to FIG. 3 for a description of the Y drive in greater detail. Corresponding elements have again been labeled with corresponding reference numerals insofar as practical. Drive shaft 60 passes through a bearing 61 and a magnetic particle type environmental seal or feedthrough 62. One such feedthrough 62 is manufactured by the FERRD FLUIDICS Corporation. This forms a vacuum seal. Also helping to keep the vacuum seal is O ring 63. The shaft also passes through bushing block 64 and sleeve bearing 65. The shaft also passes through linear actuator 70. Those skilled in the art will recognize that numerous types of linear actuators are available. A particularly advantageous linear actuator for use in the present application is manufactured by the Rohlix Corporation and described in U.S. Pat. No. 3,272,021. The linear actuator is then fixedly attached to a block 71 to which further is attached drive arm 41 as can be seen in greater detail by referring to the description of the X-drive in FIG. 4.

Figure 4:
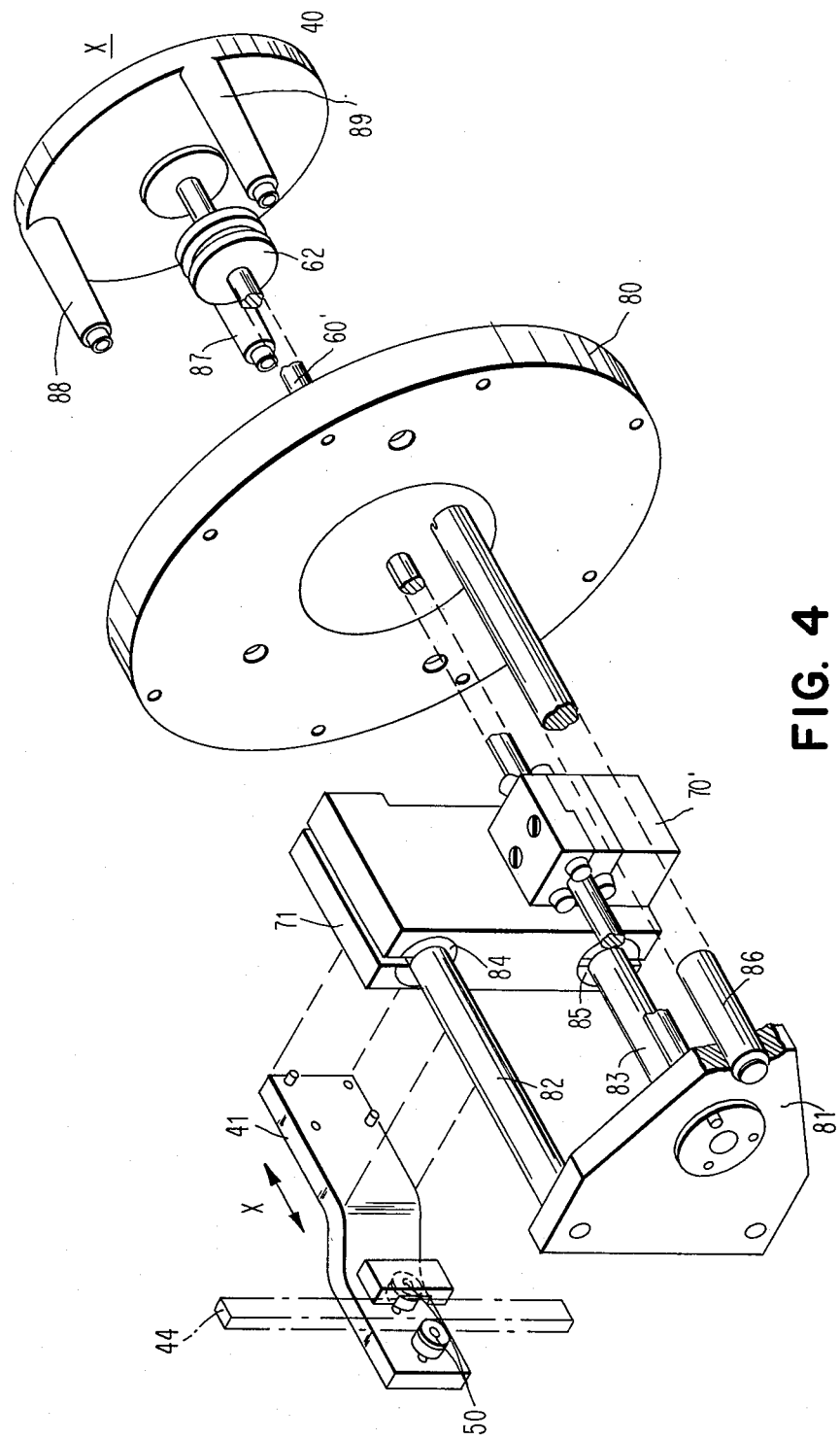
FIG. 4 is a schematic view showing the $x$ drive assembly in greater detail.

FIG. 4 further illustrates in greater detail roll bearings 50 positioned on either side of drive rail 44 which is fixedly attached to the upper stage of the X-Y table. Fig. 4 has also been numbered with corresponding reference numerals insofar as practical and previously described elements will not be discussed in detail. Note that shaft 60' passes through a magnetic particle type vacuum seal 62' and sealing ring plate 80. Shaft 60' also passes through linear actuator 70' and terminates in plate 81. Linear actuator 70' is fixedly attached to block 71 which is fixedly attached to drive arm 41. Drive arm 41 in turn engages drive rail 44 by means of roller bearings 50. Also passing through block 71 are shaft 82 and shaft 83. These shafts are held in block 71 by bushings 84 and 85, respectively. Additionally, shaft 86 extends from ring plate 80 to plate 81. Rods 87, 88, and 89 are used as stand off's to fasten the X motor 40 to the sealing ring plate 80. Note that the screw holes in plate 80 do not reach through to preserve the intended vacuum seal.

What has then been described in an improved positioning mechanism for electron beam fabrication of semiconductors. A salient feature of this invention is the vastly improved maintenance capability by providing a structure that permits the removal of the entire assembly with the front panel 14. As was previously mentioned, without this feature, the entire column 20 would have to be lifted with a crane in order to permit access into the vacuum chamber housing the X-Y table.

While the invention has been particularly shown and described with reference to a preferred embodiment thereof, it will be understood by those skilled in the art that various changes in form and details may be made therein without departing from the spirit and scope of the invention.

What is claimed is:

1. A workpiece support apparatus comprising:
   a remotely positionable workpiece support means adapted for linear motion in each of at least two orthogonal directions contained in an enclosed chamber;
   a pair of motive means mounted on the walls externally of the enclosed chamber;
   one of the walls of the chamber, having one of the motive means fixedly attached thereto;
   said one of the walls and motive means being removable together with at least a portion of the workpiece support means from the enclosed chamber;
   each said motive means having respective drive means including a drive shaft passing through an environmental seal and a linear actuator;
   said first drive means associated with a first linear actuator having a drive arm attached in fixed relation thereto with a pair of bearings mounted on said drive arm and disposed on either side of a drive rail that is fixedly mounted on a portion of said work piece support means;

such that said drive rail is adapted to slide out from between said bearings.

2. In manufacturing apparatus wherein a workpiece is mounted on an X-Y positionable work station adjacent a permanent tool for manufacturing in a critical environment, the improvement comprising:

an environmental housing having a plurality of vertical sides and having the manufacturing tool mounted adjacent thereto;

a work station adapted to linear motion in each of at least two orthogonal directions;

a first prime mover mounted on a first one of said plurality of vertical sides;

a second prime mover mounted on a second one of said plurality of vertical sides;

each said prime movers having respective drive means including a drive shaft passing through an environmental seal and a linear actuator;

said work station and said second prime mover being integrally connected to said second vertical side;

engaging means fixedly attached to the drive means associated with said first prime mover and to said work station;

said engaging means permitting relatively frictionless motion along a longitudinal axis while constraining motion perpendicular to the longitudinal axis;

such that when said second vertical side is disengaged from said environmental housing, at least a portion of said work station and second prime mover are removable together with said second vertical side.

3. In manufacturing apparatus wherein a workpiece is mounted on an X-Y positionable work station adjacent a permanent tool for manufacturing in a critical environment, the improvement comprising:

an environmental housing having a plurality of vertical sides and having the manufacturing tool mounted adjacent thereto;

a work station adapted to linear motion in each of at least two orthogonal directions;

a first prime mover mounted on a first one of said plurality of vertical sides;

a second prime mover mounted on a second one of said plurality of vertical sides;

each said prime movers having respective drive means including a drive shaft passing through an environmental seal and a linear actuator;

said work station and said second prime mover being integrally connected to said second vertical side;

such that when said second vertical side is disengaged from said environmental housing, said work station and second prime mover are removable together with said second vertical side;

said first drive means associated with a first linear actuator having a drive arm attached in fixed relation thereto with a pair of bearings mounted on said drive arm and disposed on either side of a drive rail that is fixedly mounted on a portion of said work station;

such that said drive rail is adapted to slide out from between said bearings.

4. An apparatus for manufacturing comprising:

an electron beam column;

an environmental housing having a plurality of vertical sides, mounted beneath said electron beam column;

a work station adapted to linear motion in each of at least two orthogonal directions;

a first prime mover mounted on a first one of said plurality of vertical sides;

a second prime mover mounted on a second one of said plurality of vertical sides;

each said prime movers having respective drive means including a drive shaft passing through an environmental seal and a linear actuator;

said work station and said second prime mover being integrally connected to said second vertical side;

such that when said second vertical side is disengaged from said environmental housing, said work station and second prime mover are removable together with said second vertical side;

said first drive means associated with a first linear actuator having a drive arm attached in fixed relation thereto with a pair of bearings mounted on said drive arm and disposed on either side of a drive rail that is fixedly mounted on a portion of said work station;

such that said drive rail is adapted to slide out from between said bearings.

5. A workpiece support apparatus comprising:

a remotely positionable workpiece support means adapted for linear motion in each of at least two orthogonal directions contained in an enclosed chamber;

first and second motive means mounted on the walls externally of the enclosed chambers;

one of the walls of the chamber, having the first motive means fixedly attached thereto;

said one of the walls and first motive means being removable together with at least a portion of the workpiece support apparatus from the enclosed chamber;

each said first and second motive means having respective first and second drive means;

engaging means fixedly attached to the second drive means and to said workpiece support apparatus;

said engaging means permitting relatively frictionless motion along a longitudinal axis while constraining motion perpendicular to the longitudinal axis;

such that at least a portion of said workpiece support apparatus is adapted to be disengaged from said second drive means.

* * * * *